(12) United States Patent
Moon et al.

(10) Patent No.: US 7,612,377 B2
(45) Date of Patent: Nov. 3, 2009

(54) THIN FILM TRANSISTOR ARRAY PANEL WITH ENHANCED STORAGE CAPACITORS

(75) Inventors: Kook-Chul Moon, Gyeonggi-do (KR); Soong-Yong Joo, Gyeonggi-do (KR); Il-Gon Kim, Seoul (KR); Tae-Hyeong Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/337,151

(22) Filed: Jan. 19, 2006

(65) Prior Publication Data

US 2006/0169984 A1 Aug. 3, 2006

(30) Foreign Application Priority Data

Jan. 31, 2005 (KR) .................. 10-2005-0008557

(51) Int. Cl.
*H01L 27/14* (2006.01)
*H01L 29/04* (2006.01)
*H01L 29/15* (2006.01)
*H01L 31/036* (2006.01)

(52) U.S. Cl. .......................................... 257/72; 257/59
(58) Field of Classification Search ................. 257/59, 257/72
See application file for complete search history.

(56) References Cited

U.S. PATENT DOCUMENTS 5,747,830 A * 5/1998 Okita ........................... 257/72
5,834,328 A * 11/1998 Jang .............................. 438/30

(Continued)

FOREIGN PATENT DOCUMENTS

JP 07-104312 4/1995

(Continued)

OTHER PUBLICATIONS

English Language Abstract, JP Patent Publication No. 07-104312, Apr. 21, 1995, 1 page.

(Continued)

*Primary Examiner*—Kenneth A Parker
*Assistant Examiner*—Anthony Ho
(74) *Attorney, Agent, or Firm*—Innovation Counsel LLP

(57) ABSTRACT

A thin film transistor array panel is provided. The array panel includes a storage capacitance that is substantially uniform, and allows for a relatively large capacitance in a relatively small area. In some embodiments, the panel includes: a substrate; a plurality of semiconductor regions on the substrate, including a plurality of source and drain regions doped with a first impurity type and a dummy region doped with a second impurity type, and an intrinsic region having storage and channel regions; a gate insulating layer covering at least a portion of the semiconductor regions; a gate line including a gate electrode at least partially overlapping the channel region and formed on the gate insulating layer; a storage line including a storage electrode at least partially overlapping the storage region and formed on the gate insulating layer; a data line including a source electrode connected to the source region and formed on the gate insulating layer; a drain electrode connected to the drain region and the dummy region and formed on the gate insulating layer; and a pixel electrode connected to the drain electrode.

4 Claims, 22 Drawing Sheets

U.S. PATENT DOCUMENTS

| | | | |
|---|---|---|---|
| 6,137,551 A * | 10/2000 | Jeong | 349/38 |
| 6,313,481 B1 * | 11/2001 | Ohtani et al. | 257/59 |
| 6,333,520 B1 * | 12/2001 | Inoue | 257/72 |
| 6,576,504 B2 * | 6/2003 | Ohtani et al. | 438/152 |
| 6,690,031 B1 * | 2/2004 | Ohtani et al. | 257/71 |
| 6,955,953 B2 * | 10/2005 | Yamazaki et al. | 438/162 |
| 2003/0038289 A1 * | 2/2003 | Yamazaki et al. | 257/72 |
| 2003/0094615 A1 * | 5/2003 | Yamazaki et al. | 257/72 |
| 2004/0007705 A1 * | 1/2004 | Song et al. | 257/72 |
| 2004/0096999 A1 | 5/2004 | Lin et al. | |
| 2004/1009986 * | 5/2004 | Tak et al. | 257/72 |
| 2004/0113149 A1 * | 6/2004 | Kim | 257/59 |
| 2005/0098785 A1 * | 5/2005 | You | 257/72 |
| 2005/0127367 A1 * | 6/2005 | Huh et al. | 257/72 |

FOREIGN PATENT DOCUMENTS

| | | |
|---|---|---|
| JP | 08-213625 | 8/1996 |
| JP | 2001-337348 | 12/2001 |
| JP | 2002-296619 | 10/2002 |
| JP | 2004-078236 | 11/2004 |
| KR | 100141774 | 3/1998 |
| KR | 10-0212273 | 5/1999 |
| KR | 10-1999-0080208 | 11/1999 |
| KR | 10-2000-0002472 | 1/2000 |
| KR | 10-0267981 | 7/2000 |
| KR | 10-2002-0077245 | 10/2002 |
| KR | 10-2004-0019609 | 3/2004 |
| KR | 10-0446940 | 8/2004 |

OTHER PUBLICATIONS

English Language Abstract, JP Patent Publication No. 08-213625, Aug. 20, 1996, 1 page.

English Language Abstract, JP Patent Publication No. 2001-337348, Dec. 7, 2001, 1 page.

English Language Abstract, JP Patent Publication No. 2002-296619, Oct. 9, 2002, 1 page.

English Language Abstract, JP Patent Publication No. 2004-078236, Nov. 3, 2004, 1 page.

English Language Abstract, KR Patent Publication No. 100141774, Mar. 25, 1998, 1 page.

English Language Abstract, KR Patent Publication No. 10-0212273, May 10, 1999, 1 page.

English Language Abstract, KR Patent Publication No. 10-1999-0080208, Nov. 5, 1999, 2 pages.

English Language Abstract, KR Patent Publication No. 10-2000-0002472, Jan. 15, 2000, 1 page.

English Language Abstract, KR Patent Publication No. 10-0267981, Jul. 10, 2000, 2 pages.

English Language Abstract, KR Patent Publication No. 10-2002-0077245, Oct. 11, 2002, 1 page.

English Language Abstract, KR Patent Publication No. 10-2004-0019609, Mar. 6, 2004, 1 page.

English Language Abstract, KR Patent Publication No. 10-0446940, Aug. 24, 2004, 2 pages.

* cited by examiner

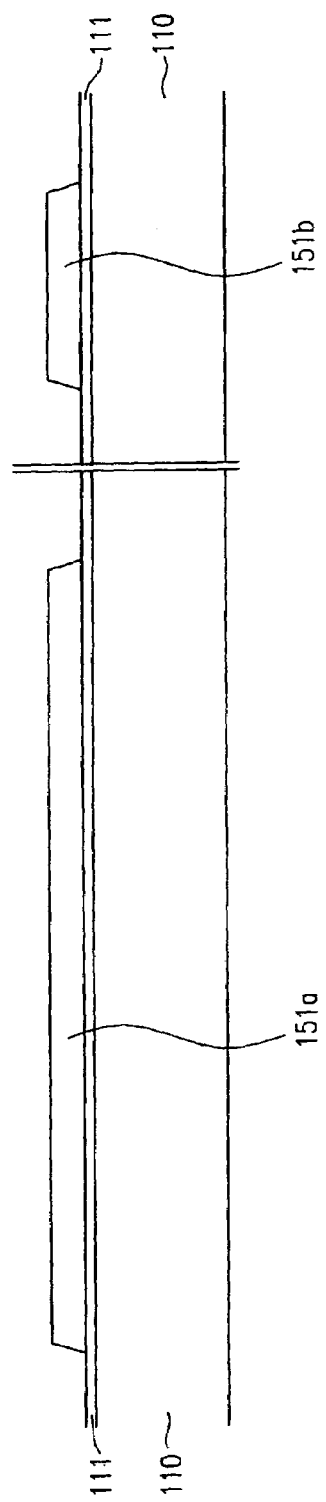

THIN FILM TRANSISTOR ARRAY PANEL WITH ENHANCED STORAGE CAPACITORS

CROSS-REFERENCE TO RELATED APPLICATIONS

This application claims priority to Korean Patent Application No. 10-2005-0008557, filed in the Korean Patent Office on Jan. 31, 2005, the disclosure of which is hereby incorporated by reference in its entirety.

BACKGROUND OF THE INVENTION (a) Field of the Invention

The present invention relates to a thin film transistor array panel; for example an array panel using polysilicon as a semiconductor.

(b) Description of Related Art

A thin film transistor array panel is used as a circuit substrate to individually drive each pixel in a flat panel display, such as a liquid crystal display or an organic light emitting display.

A typical liquid crystal display (LCD) includes two panels provided with field-generating electrodes. A first panel includes an array of pixel electrodes to apply voltages across associated pixel regions, while a second panel includes a common electrode. A liquid crystal (LC) layer is interposed between the two panels. The LCD displays images by applying voltages to the field-generating electrodes to generate an electric field in the LC layer. The orientation of LC molecules in the LC layer depends on the local electric field, and applying appropriate voltages to the pixel regions adjusts the polarization of incident light in the regions to display the desired image.

An organic light emitting display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and emit light upon pair annihilation.

A storage capacitor is provided for enhancing the voltage storing capacity in pixels of the above-described flat display types. The storage capacitor maintains a pixel voltage of pixels during a non-selected time to display an image.

The storage capacitor may have one of two different structures: a layered structure of a semiconductor layer/an insulating layer/a storage electrode, or a gate electrode/an insulating layer/a data line in the thin film transistor array panel including a semiconductor layer made of polysilicon.

Decreasing the thickness of the insulating layer may increase the storage capacitance in the former structure, but may complicate the manufacturing process, since an additional doping process is necessary to form a semiconductor layer having sufficient conductivity. Because the insulating layer is relatively thick in the latter structure, an overlapping area between the gate electrode and the data line must be increased to increase the storage capacitance, thereby decreasing an aperture ratio of the pixels.

SUMMARY OF THE INVENTION

Embodiments of the present invention provide a thin film transistor array panel with enhanced storage capacitance. The enhanced storage capacitance may be substantially uniform, and allow for a relatively large capacitance in a relatively small area, without a decrease of aperture ratio.

In general, in one aspect, thin film transistor array panel is provided. In some embodiments, the panel includes: a substrate; a plurality of semiconductor regions on the substrate, including a plurality of source and drain regions doped with a first impurity type and a dummy region doped with a second impurity type, and an intrinsic region having storage and channel regions; a gate insulating layer covering at least a portion of the semiconductor regions; a gate line including a gate electrode at least partially overlapping the channel region and formed on the gate insulating layer; a storage line including a storage electrode at least partially overlapping the storage region and formed on the gate insulating layer; a data line including a source electrode connected to the source region and formed on the gate insulating layer; a drain electrode connected to the drain region and the dummy region and formed on the gate insulating layer; and a pixel electrode connected to the drain electrode.

One of the first and the second impurities is an N-type impurity, and the other is a P-type impurity.

The drain electrode may at least partially overlap the storage electrode, and the panel may further include a blocking layer formed between the substrate and the semiconductor.

The panel may further include lightly doped regions disposed between the source and the drain region and the channel region, and the storage region may be positioned between the drain region and the dummy region.

In general, in another aspect, a display is provided. The display may include a display material such as a liquid crystal display material or an organic light emitting diode material. The display may further comprise a display panel including a storage region and a dummy region positioned adjacent the storage region on a first side of the storage region, the dummy region doped with impurities of a first impurity type. The display panel may further comprise a transistor region (such as a drain region) positioned adjacent the storage region on a second side of the storage region, the transistor region doped with impurities of a second impurity type different than the first impurity type. The first impurity type may be one of P-type and N-type, and the second impurity may be the other of P-type and N-type.

The display panel may further comprise a storage electrode at least partially overlapping (e.g., substantially overlapping) the storage region and separated from the storage region by a dielectric region, and a transistor electrode connected to the transistor region and the dummy region, the transistor electrode at least partially overlapping (e.g., substantially overlapping) the storage electrode and separated from the storage electrode by a dielectric region. The display panel may further include a pixel electrode region connected to the transistor electrode. A storage capacitor may comprise the storage electrode, the storage region, and the dielectric region separating the storage electrode from the storage region.

In operation of the display panel, a pre-determined voltage may be applied to the storage electrode. When a pixel voltage applied to the transistor electrode is higher than the pre-determined voltage, an electric field may be formed between the dummy region and the storage electrode. When a pixel voltage applied to the transistor electrode is lower than the pre-determined voltage, an electric field may be formed between the transistor region and the storage electrode. The display panel may further comprise a gate region positioned proximate to the transistor region and separated therefrom by a gate insulating region, and the dielectric separating the storage electrode from the storage region may be on the same layer as the gate insulating region.

BRIEF DESCRIPTION OF THE DRAWINGS

The present invention will become more apparent by describing embodiments thereof in detail with reference to the accompanying drawings, in which:

FIG. 7C is a sectional view of the TFT array panel shown in FIGS. 7A and 7B taken along the lines VIIC-VIIC', VIIC'-VIIC'', and VIIC''-VIIC''';

DETAILED DESCRIPTION

Figure 1:
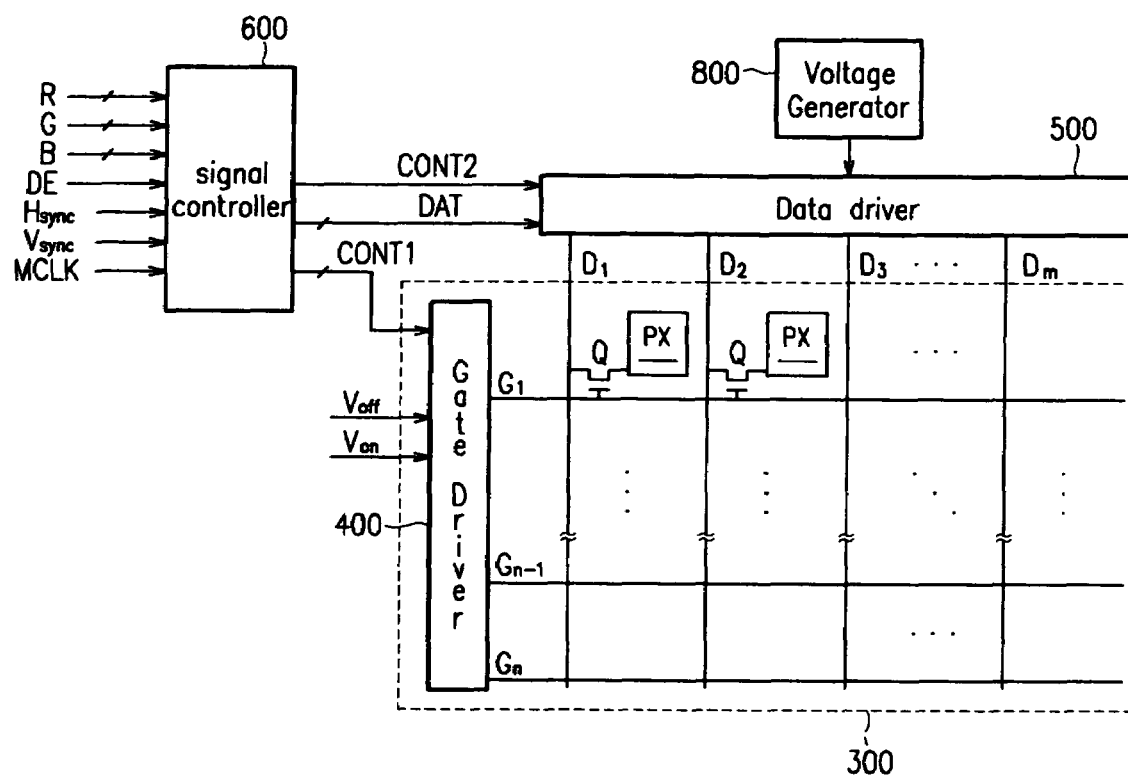
FIG. 1 is a block diagram of an LCD according to an embodiment of the present invention.

Embodiments of he present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

Liquid crystal displays (as an example of display devices according to embodiments of the present invention) will now be described with reference to the accompanying drawings. However, embodiments may be used with other display types, such as OLED displays.

Figure 2:
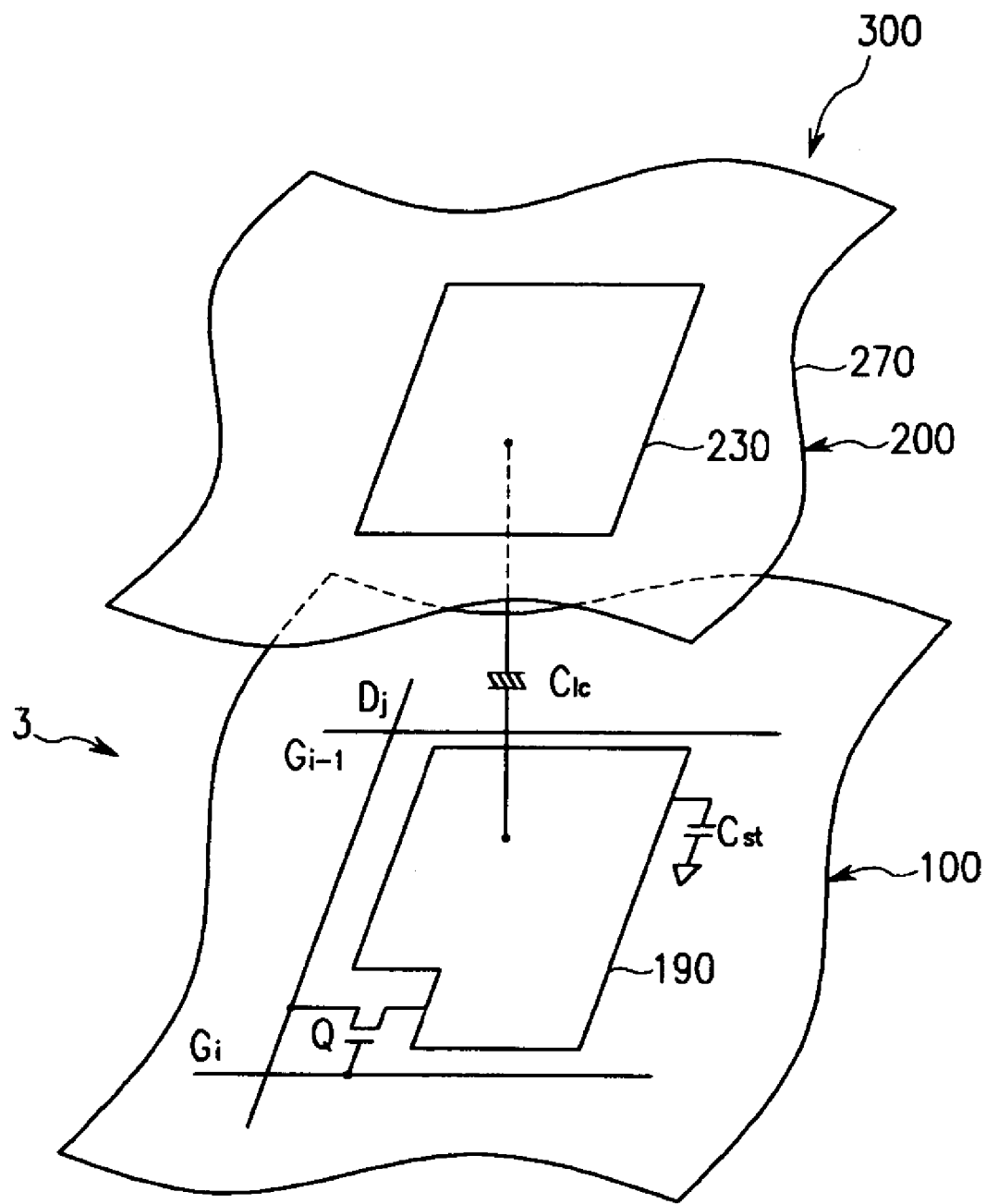
FIG. 2 is an equivalent circuit diagram of a pixel of an LCD according to an embodiment of the present invention.

Referring to FIGS. 1 and 2, an LCD according to an embodiment of the present invention will be described in detail.

FIG. 1 is a block diagram of an LCD according to an embodiment of the present invention, and FIG. 2 is a structural view of an LCD panel assembly including an equivalent circuit diagram of a pixel of an LCD according to an embodiment of the present invention.

Referring to FIG. 1, an LCD according to the embodiment includes an LC panel assembly 300, a gate driver 400 and a data driver 500 that are connected to the panel assembly 300, a gray voltage generator 800 connected to the data driver 500, and a signal controller 600 controlling the above elements.

Referring to FIG. 1, the panel assembly 300 includes a plurality of display signal lines $G_1$-$G_n$ and $D_1$-$D_m$ and a plurality of pixels PX connected thereto and arranged substantially in a matrix. In the structural view shown in FIG. 2, the panel assembly 300 includes lower and upper panels 100 and 200 and an LC layer 3 interposed therebetween.

The display signal lines $G_1$-$G_n$ and $D_1$-$D_m$ are disposed on the lower panel 100, and include a plurality of gate lines $G_1$-$G_n$ transmitting gate signals (also referred to as "scanning signals") and a plurality of data lines $D_1$-$D_m$ transmitting data signals. The gate lines $G_1$-$G_n$ extend substantially in a row direction and are substantially parallel to each other, while the data lines $D_1$-$D_m$ extend substantially in a column direction and are substantially parallel to each other.

Each pixel PX includes a switching element Q connected to associated signal lines $G_i$ and $D_j$ of the signal lines $G_1$-$G_n$ and $D_1$-$D_m$, an LC capacitor Clc, and (if desired) a storage capacitor Cst that are connected to the switching element Q. If unnecessary, the storage capacitor Cst may be omitted.

The switching element Q including a TFT is provided on a lower panel 100, and has three terminals: a control terminal connected to gate line $G_i$ of the gate lines $G_1$-$G_n$; an input terminal connected to data line $D_j$ of the data lines $D_1$-$D_m$; and an output terminal connected to both the LC capacitor Clc and the storage capacitor Cst.

The LC capacitor Clc includes a pixel electrode 190 provided on the lower panel 100 and a common electrode 270 provided on an upper panel 200, as two terminals. The LC layer 3 disposed between the two electrodes 190 and 270 functions as a dielectric of the LC capacitor Clc. The pixel electrode 190 is connected to the switching element Q, and the common electrode 270 is supplied with a common voltage Vcom and covers an entire surface of the upper panel 200. In different embodiments (not shown in FIG. 2), the common electrode 270 may be provided on the lower panel 100, and both electrodes 190 and 270 may have shapes of bars or stripes.

The storage capacitor Cst is an auxiliary capacitor for the LC capacitor Clc. In some embodiments, the storage capacitor Cst includes the pixel electrode 190, and a separate signal line which is provided on the lower panel 100, which at least partially overlaps the pixel electrode 190 via an insulator. The signal line on the lower panel 100 is supplied with a predetermined voltage, such as the common voltage Vcom. In some embodiments, the storage capacitor Cst includes the pixel electrode 190 and an adjacent gate line called a previous gate line, which at least partially overlaps the pixel electrode 190 via an insulator.

For color display, each pixel PX uniquely represents one of three primary colors (i.e., spatial division), or each pixel PX represents three primary colors in turn (i.e., time division), such that a spatial or temporal sum of the three primary colors is recognized as a desired color. FIG. 2 shows an example of the spatial division in which each pixel is provided with a color filter 230, e.g., one of red, green, and blue color filters, in an area of the upper panel 200 facing the pixel electrode 190. Alternatively, the color filter 230 is provided on or under the pixel electrode 190 on the lower panel 100.

One or more polarizers (not shown) are attached to the panels 100 and 200.

Each pixel PX of an organic light emitting display (OLED) includes a switching element (not shown) connected to an associated gate line $G_i$ and data line $D_j$ of the signal lines $G_1$-$G_n$ and $D_1$-$D_m$, a driving element (not shown), and capacitors that are connected to the switching and the driving elements. The OLED includes an anode (hole injection electrode), a cathode (electron injection electrode), and an organic light emission layer interposed therebetween.

Referring to FIG. 1 again, the gray voltage generator 800 generates two sets of a plurality of gray voltages, where each of the plurality of gray voltages is associated with a desired transmittance of the associated pixel PX. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300 and produces the gate-on voltage Von and the gate-off voltage Voff from an external device to generate gate signals for application to the gate lines $G_1$-$G_n$. The gate driver 400 is mounted on the panel assembly 300, and it may include a plurality of IC (integrated circuit) chips.

The data driver 500 is connected to the data lines $D_1$-$D_m$ of the panel assembly 300 and applies data voltages, which are selected from the gray voltages supplied from the gray voltage generator 800, to the data lines $D_1$-$D_m$. The data driver 500 is also mounted on the panel assembly 300 and it may also include a plurality of IC chips.

The IC chips of the drivers 400 and 500 may be mounted on flexible printed circuit (FPC) films as a TCP (tape carrier package), and are attached to the LC panel assembly 300. Alternately, the drivers 400 and 500 may be integrated into the panel assembly 300 along with the display signal lines $G_1$-$G_n$ and $D_1$-$D_m$, and the TFT switching elements Q.

The signal controller 600 controls the gate driver 400 and the data driver 500, and it may be mounted on a printed circuit board (PCB).

A TFT array panel for an LCD according to an embodiment of the present invention will now be described in detail, with reference to FIGS. 3 to 6 as well as FIGS. 1 and 2.

Examples of display device elements incorporating N- and P-type doped regions will be respectively described with regard to pixels PX and the gate and data drivers 400 and 500, according to embodiments of the present invention. The gate and data drivers 400 and 500 may each include the N- and P-type regions.

Figure 3:
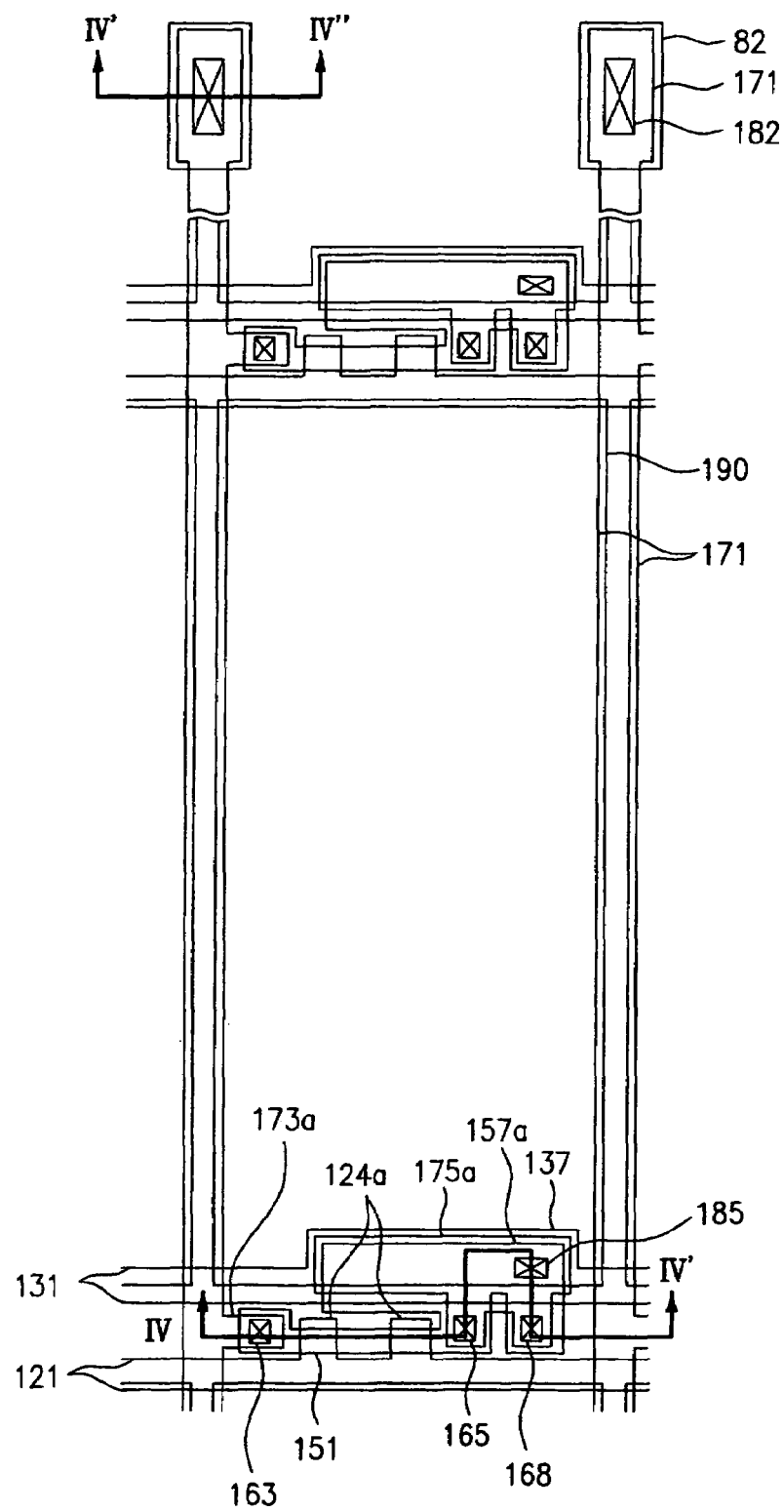
FIG. 3 is a layout view of the TFT array panel shown in FIGS. 1 and 2 according to an embodiment of the present invention.
Figure 4:
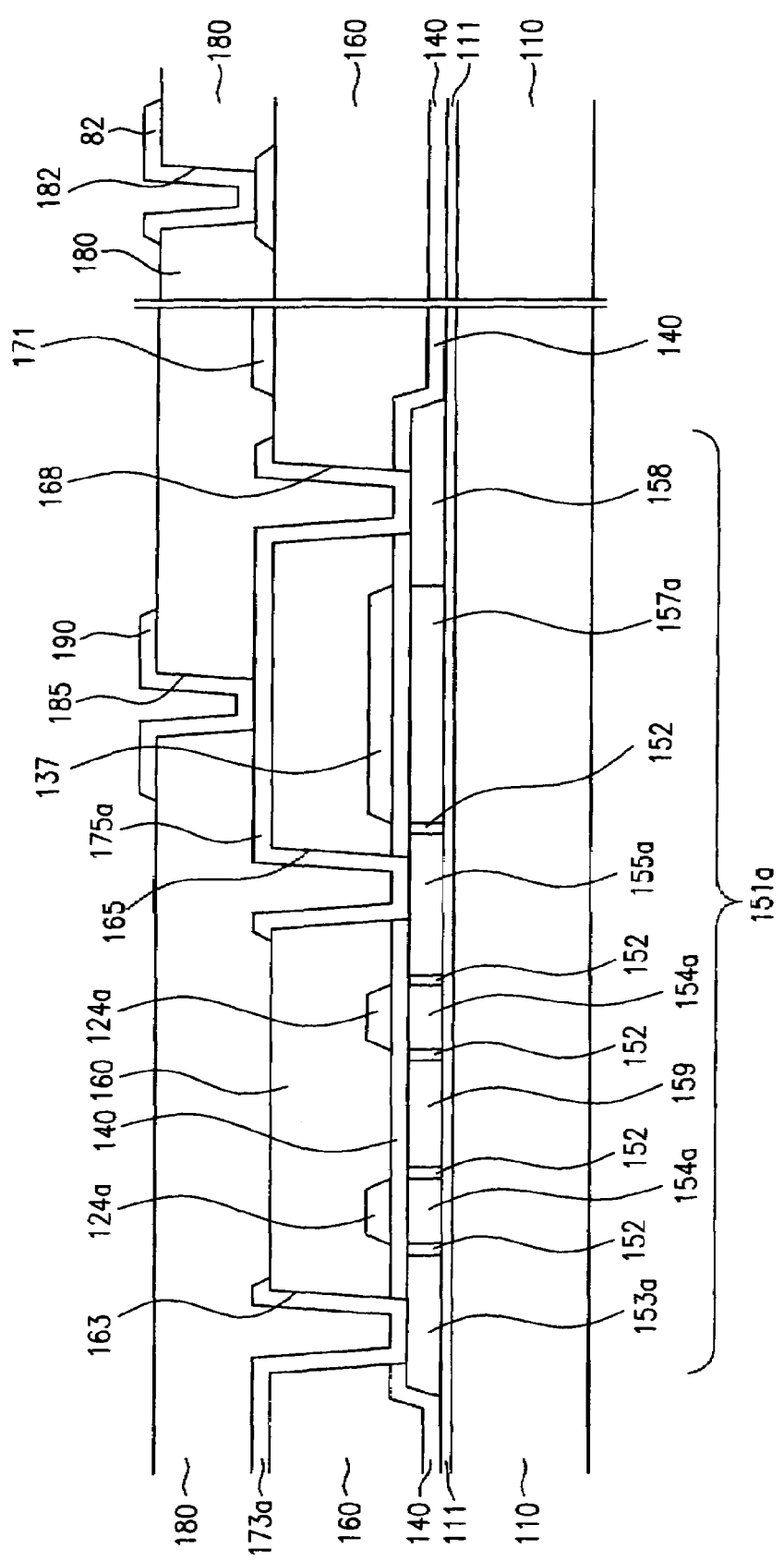
FIG. 4 is a sectional view of the display area shown in FIG. 3 taken along the lines IV-IV'-IV''.
Figure 5:
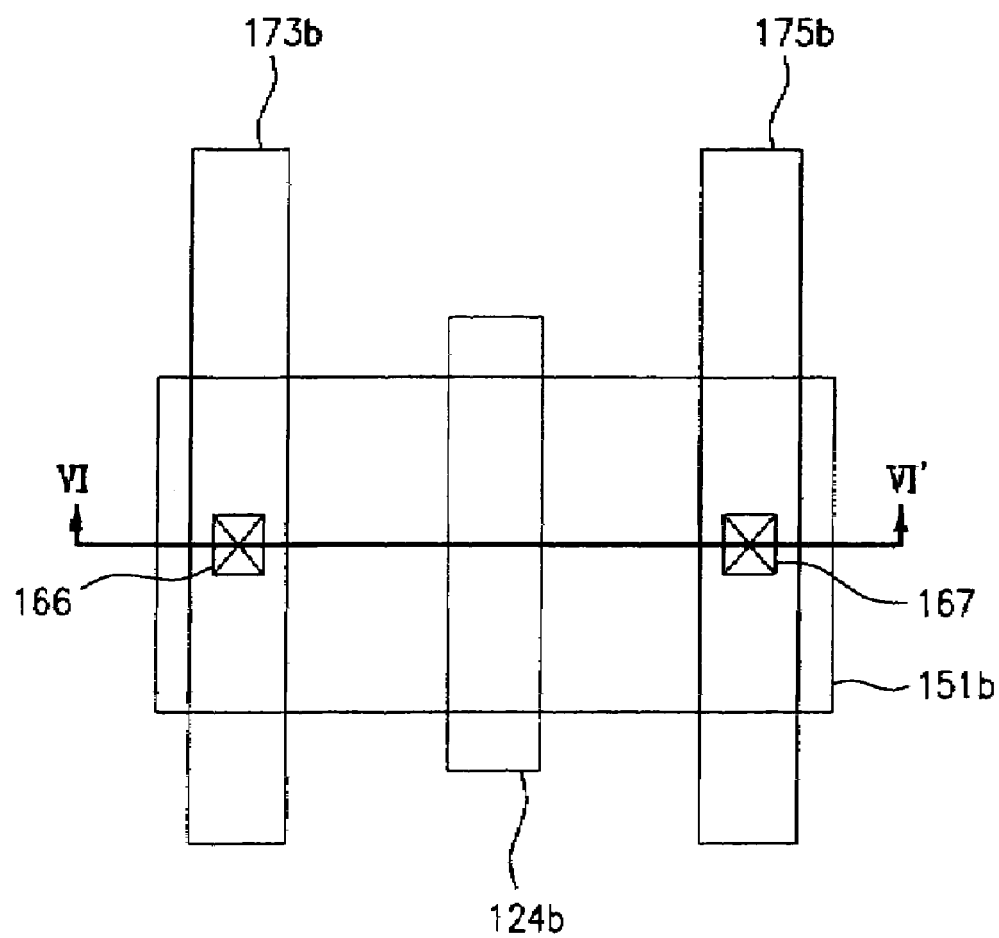
FIG. 5 is a layout view of a transistor of the gate driver shown in FIGS. 1 and 2 according to an embodiment of the present invention.
Figure 6:
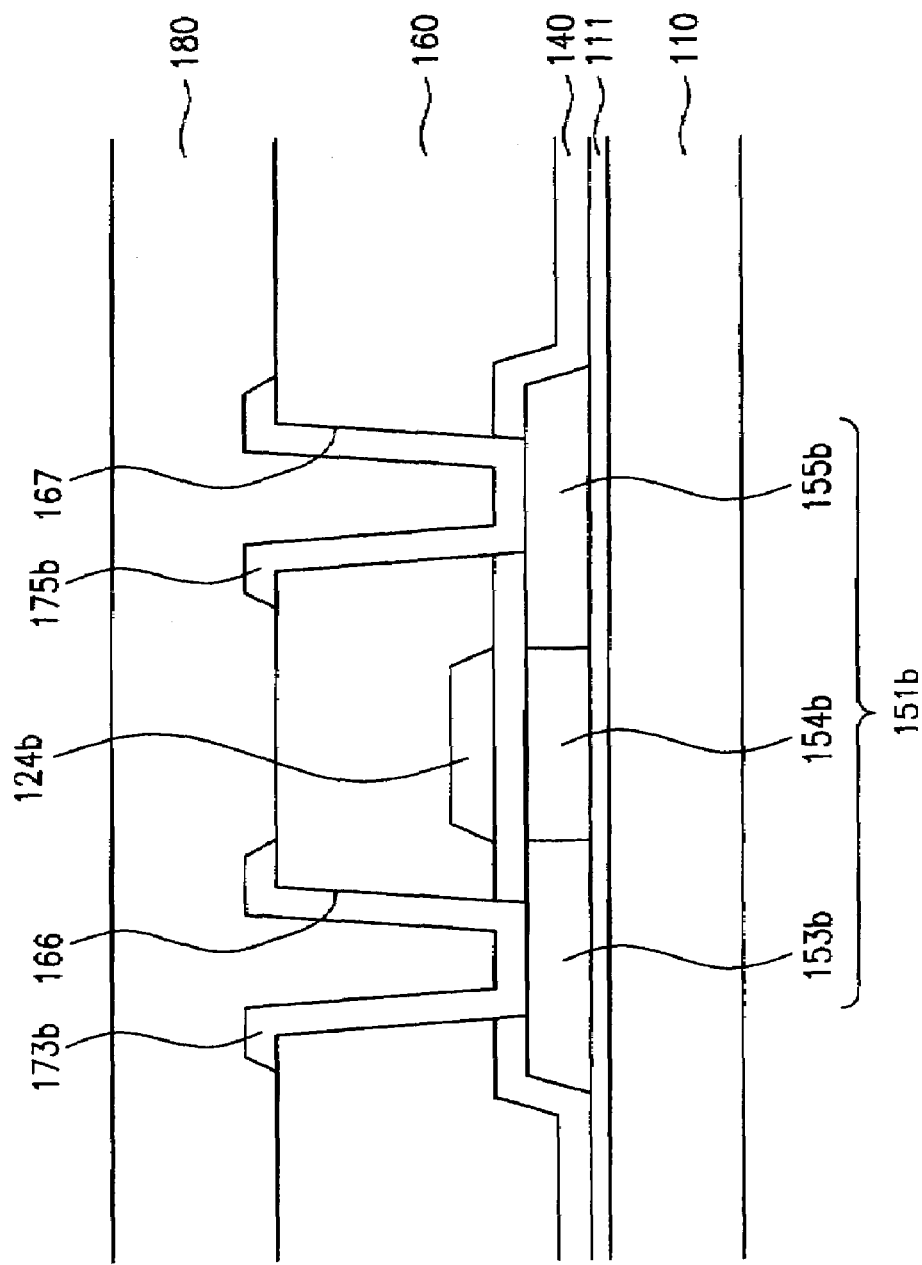
FIG. 6 is a sectional view of the thin film transistor shown in FIG. 5 taken along the lines VI-VI'.

FIG. 3 is a layout view of the TFT array panel shown in FIGS. 1 and 2 according to an embodiment of the present invention; FIG. 4 is a sectional view of the display area shown in FIG. 3 taken along the lines IV-IV'-IV"; FIG. 5 is a layout view of a transistor of the gate driver shown in FIGS. 1 and 2 according to an embodiment of the present invention; and FIG. 6 is a sectional view of the thin film transistor shown in FIG. 5 taken along the line VI-VI'.

A blocking film 111, preferably comprising silicon oxide ($SiO_2$) in some embodiments and comprising silicon nitride (SiNx) in other embodiments, is formed on an insulating substrate 110 which may comprise a material such as transparent glass, quartz, or sapphire. The blocking film 111 may have a dual-layered structure.

A plurality of semiconductor islands 151a and 151b, preferably comprising polysilicon, are formed on the blocking film 111. Semiconductor islands 151a comprise extrinsic regions containing N-type conductive impurities, while islands 151b comprise extrinsic regions containing P-type conductive impurities. Semiconductor islands 151a and 151b further include at least one intrinsic region containing relatively few of the conductive impurities.

For the semiconductor island 151a of the display area, the intrinsic regions include a channel region 154a and a storage region 157a. The extrinsic regions are doped with N-type impurities such as phosphorous (P) and arsenic (As), and they include a plurality of heavily doped regions such as source and drain regions 153a and 155a separated from each other with respect to the channel region 154a and dummy region 159. The extrinsic region further includes dummy region 158 doped with P-type impurities, and a plurality of lightly doped regions 152 disposed between the intrinsic regions 154a and 157a and the heavily doped regions 153a, 155a, and 159. Here, the number of source and the drain regions may vary, and the number of channel regions may vary depending on the number of source and drain regions.

For the semiconductor island 151b of the driver, the intrinsic regions include a channel region 154b, and the extrinsic regions are also doped with P-type impurities such as boron (B) and gallium (Ga). The extrinsic regions include a plurality of heavily doped regions, such as source and drain regions 153b and 155b, separated from each other with respect to the channel region 154b.

The lightly doped regions 152 have relatively small thicknesses and lengths compared with the heavily doped regions 153a, 155a, and 159, and are disposed close to surfaces of the semiconductor islands 151a. The lightly doped regions 152 disposed between the source region 153a and the channel region 154a and between the drain region 155a and the channel region 154a are referred to as "lightly doped drain (LDD) regions", and they substantially prevent leakage current of TFTs. The LDD regions may be substituted with offset regions that contain substantially no impurities.

A gate insulating layer 140 comprising silicon oxide ($SiO_2$) or silicon nitride (SiNx) is formed on the semiconductor islands 151a and 151b.

A plurality of gate conductors including a plurality of gate lines 121, a plurality of storage electrode lines 131, and a plurality of gate electrodes 124b are formed on the gate insulating layer 140, respectively.

The gate lines 121 for transmitting gate signals extend substantially in a transverse direction (horizontally in FIG. 3) and include a plurality of gate electrodes 124b for pixels protruding downward to overlap the channel areas 154b of the semiconductor islands 151b. Each gate line 121 may include an expanded end portion having a large area for contact with another layer or an external driving circuit. The gate lines 121 may be directly connected to a gate driving circuit for generating the gate signals. The gate driving circuit may be integrated on the substrate 110.

The storage electrode lines 131 are supplied with a predetermined voltage such as a common voltage, and they include a plurality of storage electrodes 137 protruding upward and downward and overlapping the storage regions 157a of the semiconductor islands 151a.

The gate electrode 124b overlaps the channel region 154b of the semiconductor island 154b, and is connected to the signal line (not shown) to apply a control signal.

The gate conductors 121, 131, and 124b preferably comprise a low resistivity material. The material may include an aluminum (Al)-containing metal such as Al and an Al alloy (e.g. Al—Nd), a silver (Ag)-containing metal such as Ag and an Ag alloy, a copper (Cu)-containing metal such as Cu and a Cu alloy, a molybdenum (Mo)-containing metal such as Mo and a Mo alloy, chromium (Cr), titanium (Ti), and tantalum (Ta). The gate conductors 121, 131, and 124b may have a multi-layered structure including two films having different physical characteristics. One of the two films preferably comprises a low resistivity metal such as an Al-containing metal an Ag-containing metal, and/or a Cu-containing metal for reducing signal delay and/or voltage drop in the gate conductors 121, 131, 124a, and 124b. The other film preferably comprises a material such as Cr, Mo, a Mo alloy, Ta, or Ti, which are materials that have good physical, chemical, and electrical contact characteristics with other materials such as indium tin oxide (ITO) and indium zinc oxide (IZO). Good examples of the combination of the two films are a lower Cr film and an upper Al—Nd alloy film, and a lower Al film and an upper Mo film.

In addition, the lateral sides of the gate conductors 121, 131, and 124b are inclined relative to a surface of the substrate 110, and the inclination angle thereof ranges from about 30 degrees to about 80 degrees.

An interlayer insulating layer 160 is formed on the gate conductors 121, 131, and 124b. In embodiments, the interlayer insulating layer 160 preferably comprises a photosensitive organic material having a good flatness characteristics, a low dielectric constant (low-k) insulating material such as a-Si:C:O or a-Si:O:F, which may be formed by plasma enhanced chemical vapor deposition (PECVD), or an inorganic material such as silicon nitride or silicon oxide.

The interlayer insulating layer 160 has a plurality of contact holes 163, 165, 166, 167, and 168 respectively exposing the source regions 153a and 153b, the drain regions 155a and 155b, and the dummy region 158.

A plurality of data conductors including a plurality of data lines 171, a plurality of drain electrodes 175a for pixels, and a plurality of source and drain electrodes 173b and 175b for the driver are formed on the interlayer insulating layer 160.

The data lines 171 for transmitting data voltages extend substantially in the longitudinal direction (vertically in FIG. 3 and into the page in FIG. 4) and cross the gate lines 121. Each data line 171 includes a plurality of source electrodes 173a for pixels connected to the source regions 153a through the contact holes 163. Each data line 171 may include an expanded end portion having a large area for contact with another layer or an external driving circuit. The data lines 171 may be directly connected to a data driving circuit for generating the data signals. The data driving circuit may be integrated on the substrate 110.

The source electrodes 173b are connected to the source regions 153b through the contact holes 166. The source and the drain electrodes 173b and 175b are separated from each other, and may be connected to other signal lines.

The drain electrodes 175a and 175b are separated from the source electrodes 173a and 173b and connected to the drain regions 155a and 155b through the contact holes 165 and 167. The drain electrode 175a is also connected to the dummy region 158 through the contact hole 168, and overlaps the storage electrode 137 to form a storage capacitor.

The data conductors 171, 175a, 173b, and 175b preferably comprise a refractory metal including Cr, Mo, Ti, Ta, or alloys thereof. They may have a multi-layered structure preferably including a low resistivity film and a film with good contact characteristics. Good examples of multi-layered structures that may be used include structures having a Mo lower film, an Al middle film, and a Mo upper film, as well as the above-described structures with combinations of a Cr lower film and an Al—Nd upper film and an Al lower film and a Mo upper film.

Like the gate conductors 121, 131, and 124b, the data conductors 171, 175a, 173b, and 175b have tapered lateral sides relative to a surface of the substrate 110, and the inclination angles thereof range from about 30 degrees to about 80 degrees.

A passivation layer 180 is formed on the data conductors 171, 175a, 173b, and 175b and the interlayer insulating layer 160. In some embodiments, the passivation layer 180 preferably comprises a photosensitive organic material having a good flatness characteristics, a low dielectric insulating material such as a-Si:C:O or a-Si:O:F (which may be formed by PECVD), or an inorganic material such as silicon nitride or silicon oxide.

The passivation layer 180 has a plurality of contact holes 185 and 182 respectively exposing the drain electrodes 175a and end portions 179 of the data lines 171. The passivation layer 180 and the interlayer insulating layer 160 may further have a plurality of contact holes (not shown) exposing end portions of the gate lines 121.

A plurality of pixel electrodes 190 and a plurality of contact assistants 82, which are preferably made of at least one of a transparent conductor such as ITO or IZO and opaque reflective conductor such as Al or Ag, are formed on the passivation layer 180.

The pixel electrodes 190 are physically and electrically connected to the drain electrodes 175a through the contact holes 185 such that the pixel electrodes 190 receive the data voltages from the drain regions 155a via the drain electrodes 175a.

The contact assistants 82 are connected to the end portions 179 of the data lines 171 through the contact holes 182. The contact assistants 82 protect the end portions 179 and complement the adhesion of the end portions 179 to external devices.

Referring back to FIG. 2, data voltages applied to pixel electrodes 190 and the common voltage applied to common electrode 270 of upper panel 200 generate electric fields in the associated pixel regions. The local electric field determines the orientations of liquid crystal molecules in a liquid crystal layer 3 disposed between a particular pixel electrode 190 and common electrode 270.

As described above, a pixel electrode 190 and a common electrode 270 form a liquid crystal capacitor, and a pixel electrode 190 and a drain region 155a connected thereto and a storage electrode line 131 including the storage electrodes 137 form a storage capacitor.

In the embodiment illustrated in FIGS. 1-6, storage capacitance is provided by the overlap of pixel electrode 190 with the storage electrode line 131 and the drain electrode 175a, and the overlap of storage electrode 137 with the drain electrode 175a and the storage region 157, as described below.

The drain electrode 175a simultaneously contacts the extrinsic regions 155a and 158, respectively doped with N- and P-type impurities. Accordingly, uniform storage capacitance of the storage capacitor may be maintained upon inversion of the liquid crystal display. That is to say, the pixel voltage applied to the drain electrode 175a may be higher or lower than the predetermined voltage of the storage electrode 137. When the pixel voltage applied to the drain electrode 175a is higher than the predetermined voltage of the storage electrode 137, the electric field is formed between the dummy region 158 with the P-type impurities and the storage electrode 137, and the storage capacitor is formed between the storage region 157a and the storage electrode 137. When the pixel voltage applied to the drain electrode 175a is less than the predetermined voltage of the storage electrode 137, the electric field is formed between the drain region 155a with the N-type impurities and the storage electrode 137, and the storage capacitor is formed between the storage region 157a and the storage electrode 137. Accordingly, the storage capacitor may have uniform storage capacitance.

Furthermore, because the gate insulating layer 140 (which acts as a dielectric for the storage capacitor including the storage region 157a and the storage electrode 137) is thin, the storage capacitance may be relatively large in a relatively small area compared to other configurations. Additionally, since the storage capacitor may be formed without an additional process, the manufacturing process of the thin film transistor array panel is simplified.

Now, a method of manufacturing the TFT array panel shown in FIGS. 3 to 6 according to an embodiment of the present invention will be now described in detail with reference to FIGS. 7A to 12C as well as FIGS. 3 to 6.

Figure 7A:
FIGS. 7A and 7B are layout views of the TFT array panel shown in FIGS. 3 to 6 in the first step of a manufacturing method thereof according to an embodiment of the present invention.
Figure 7B:
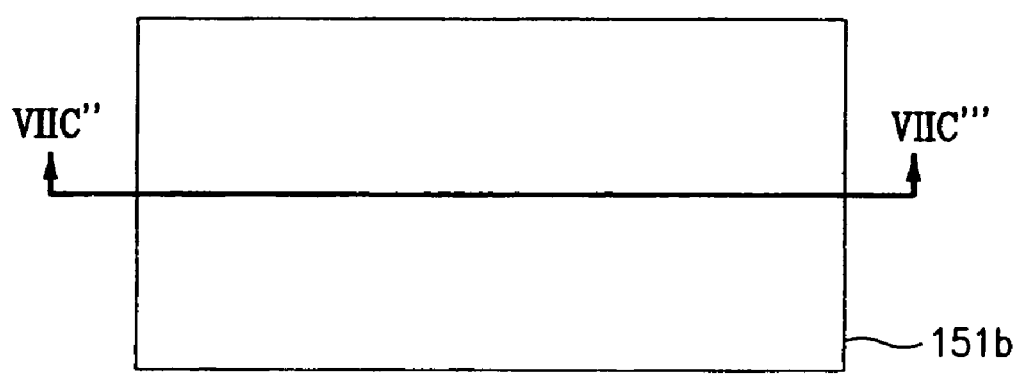
Figure 8A:
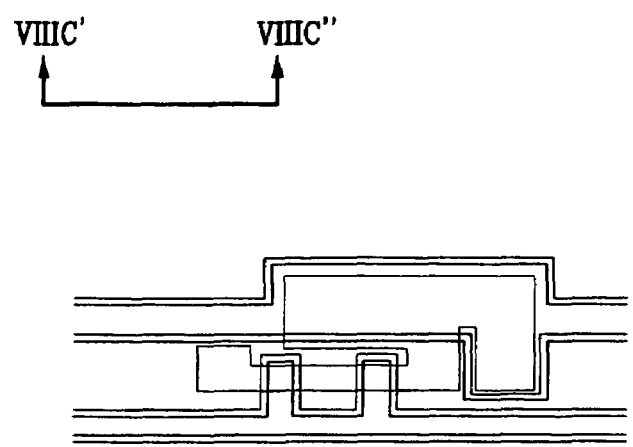
FIGS. 8A and 8B are layout views of the TFT array panel in the step following the step shown in FIGS. 7A to 7C.
Figure 8A:
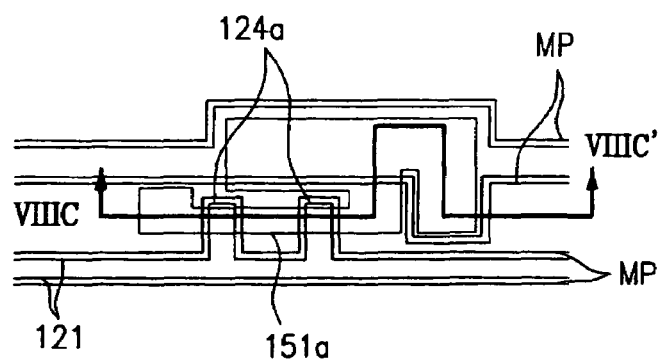
Figure 8B:
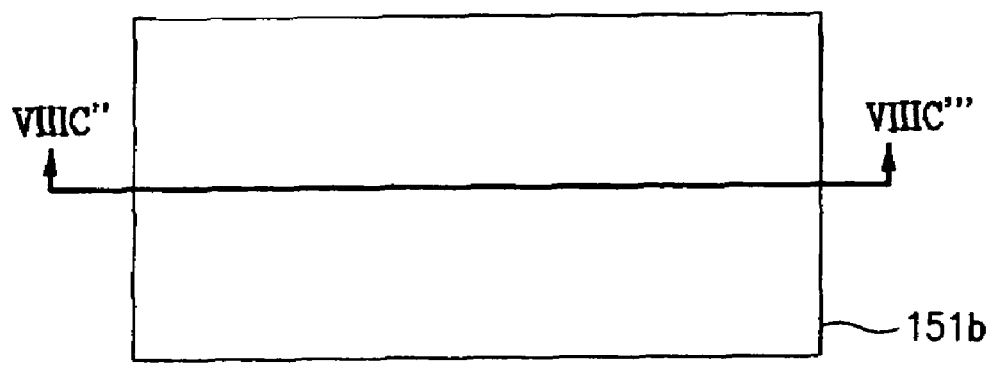
Figure 8C:
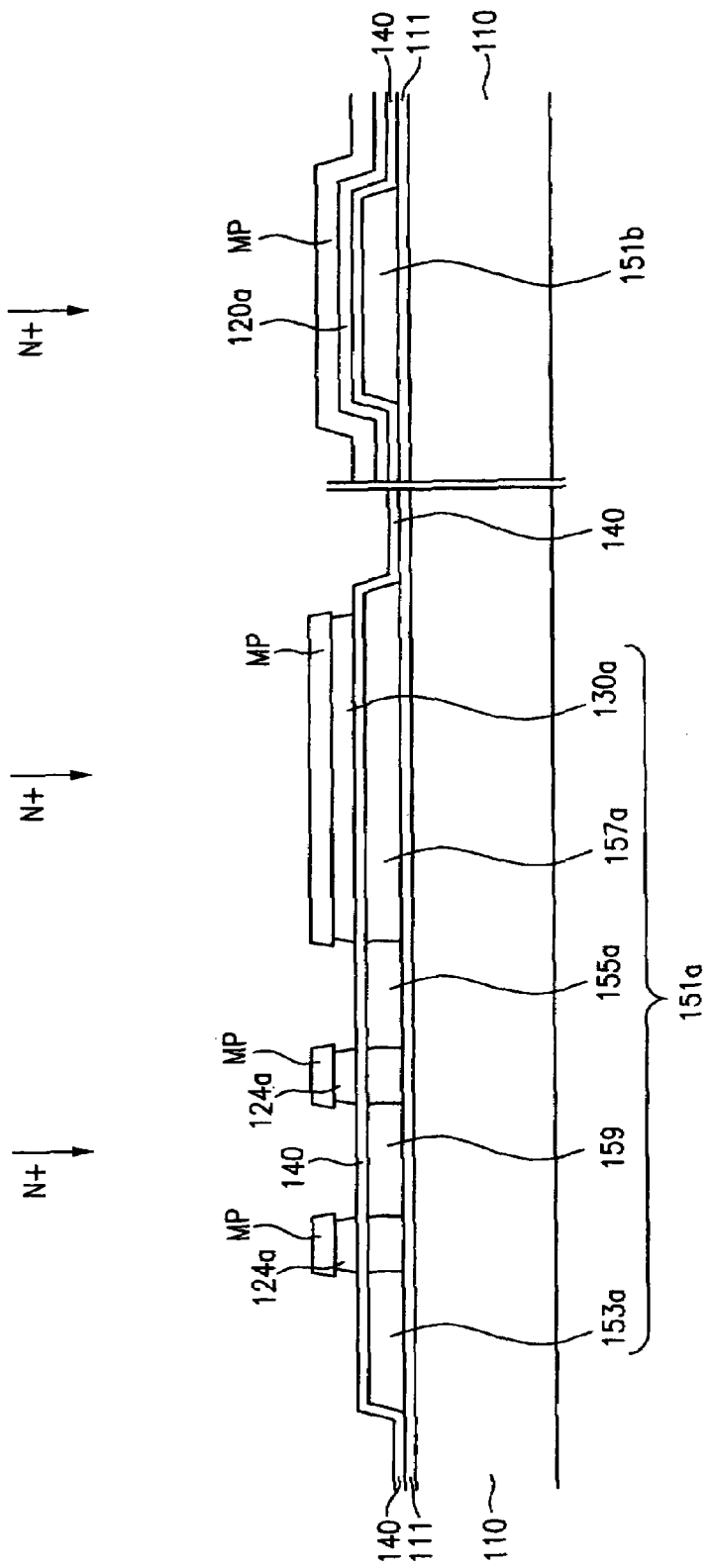
FIG. 8C is a sectional view of the TFT array panel shown in FIGS. 8A and 8B taken along the lines VIIIC-VIIIC', VIIIC'-VIIIC'', and VIIIC''-VIIIC'''.
Figure 9:
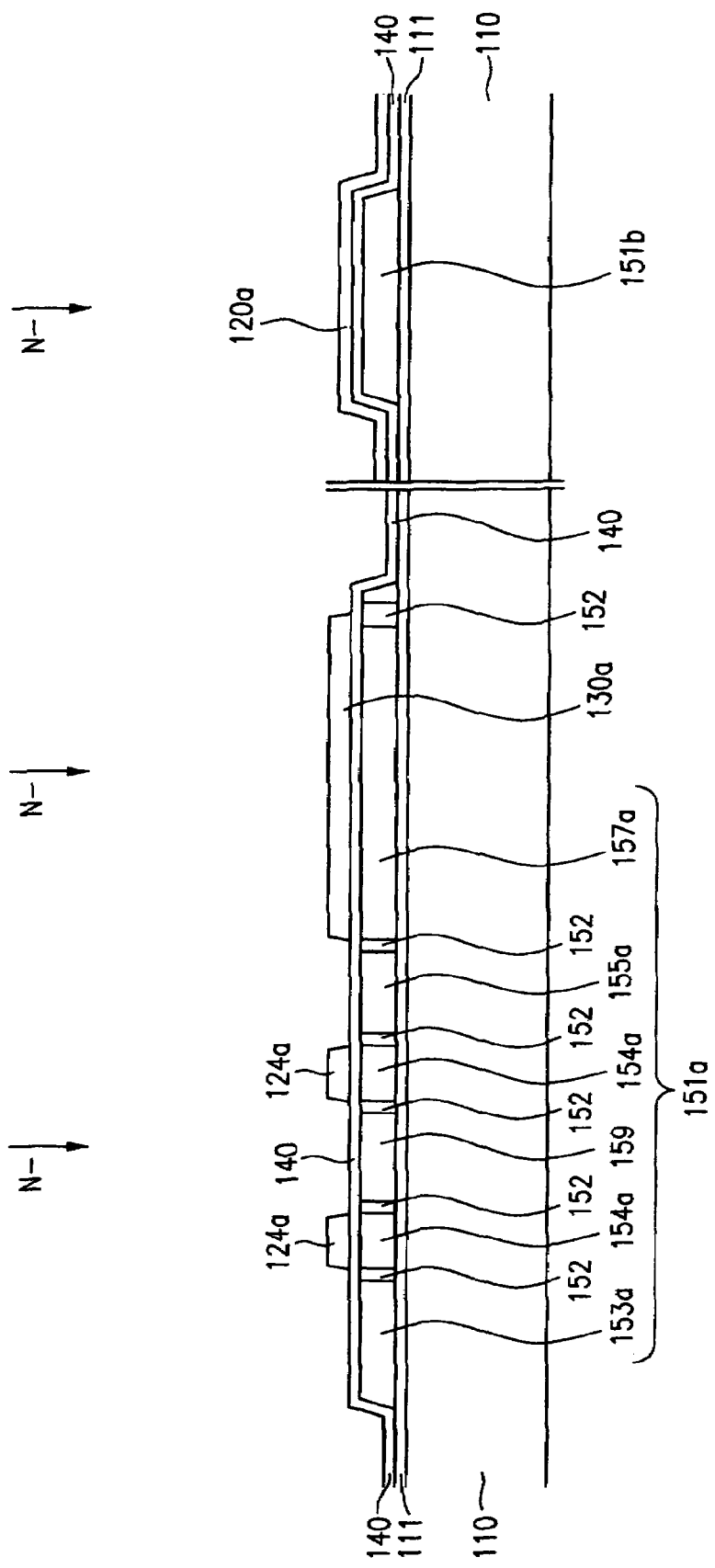
FIG. 9 is a sectional view of the TFT array panel in the step following the step shown in FIGS. 8A to 8C.
Figure 10A:
FIGS. 10A and 10B are layout views of the TFT array panel in the step following the step shown in FIG. 9.
Figure 10A:
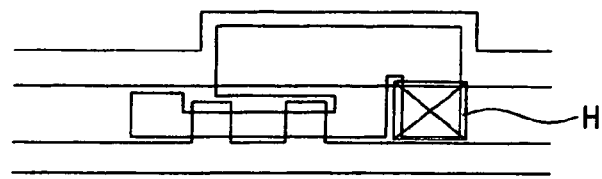
Figure 10A:
Figure 10A:
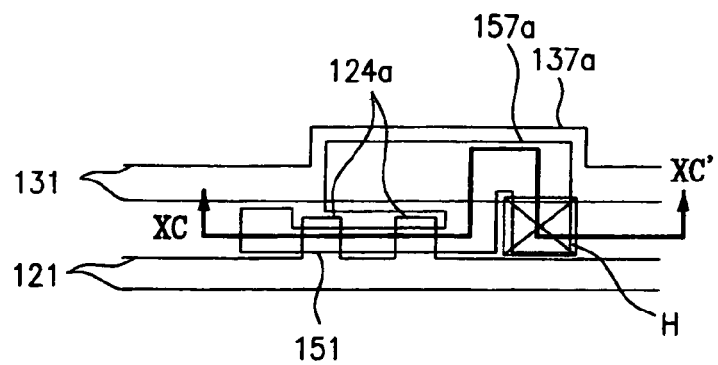
Figure 10B:
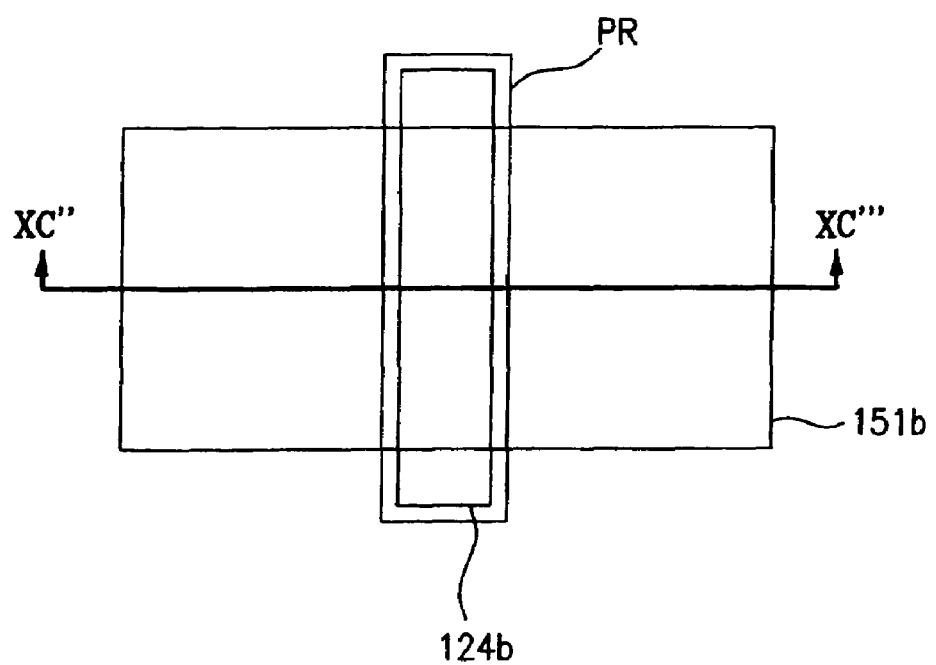
Figure 10C:
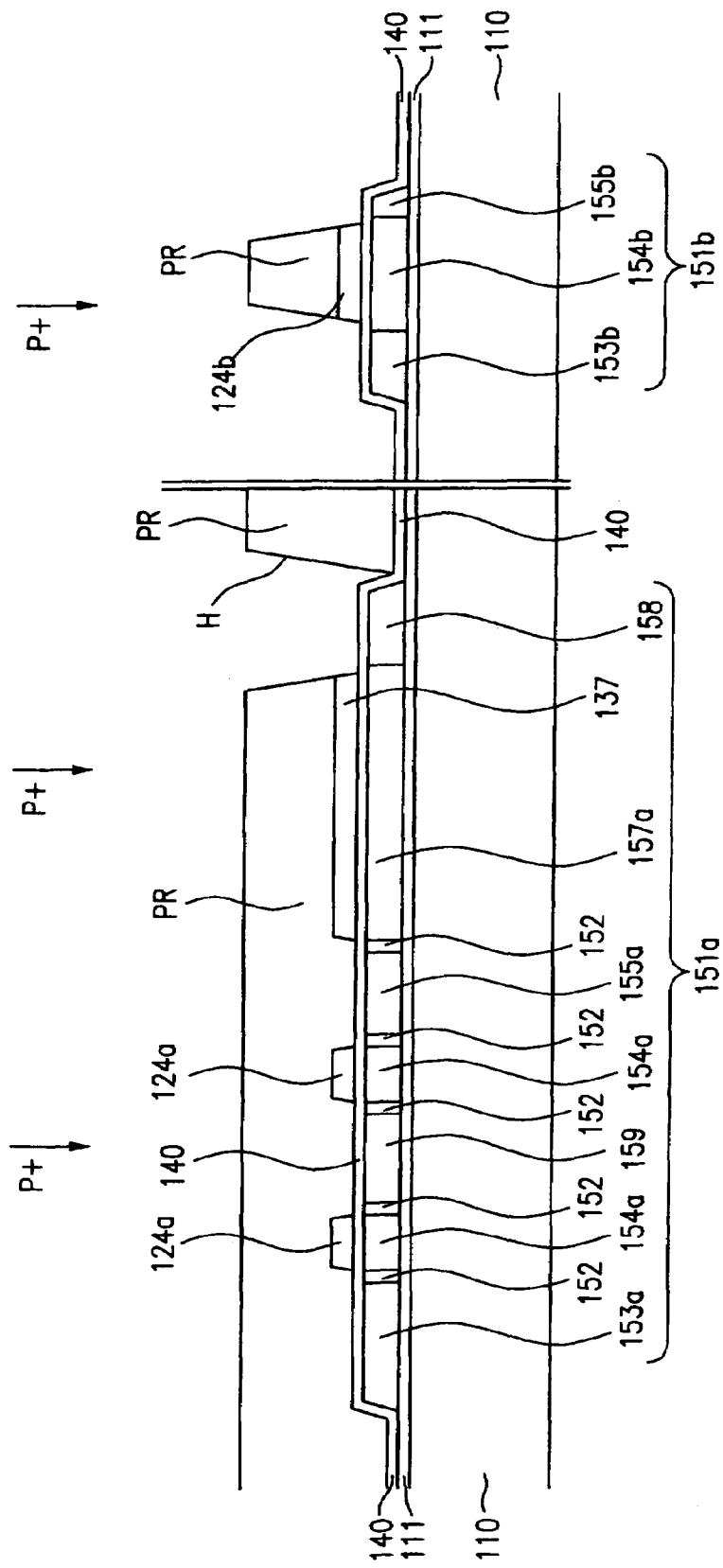
FIG. 10C is a sectional view of the TFT array panel shown in FIGS. 10A and 10B taken along the lines XC-XC', XC'-XC'', and XC''-X'''.
Figure 11A:
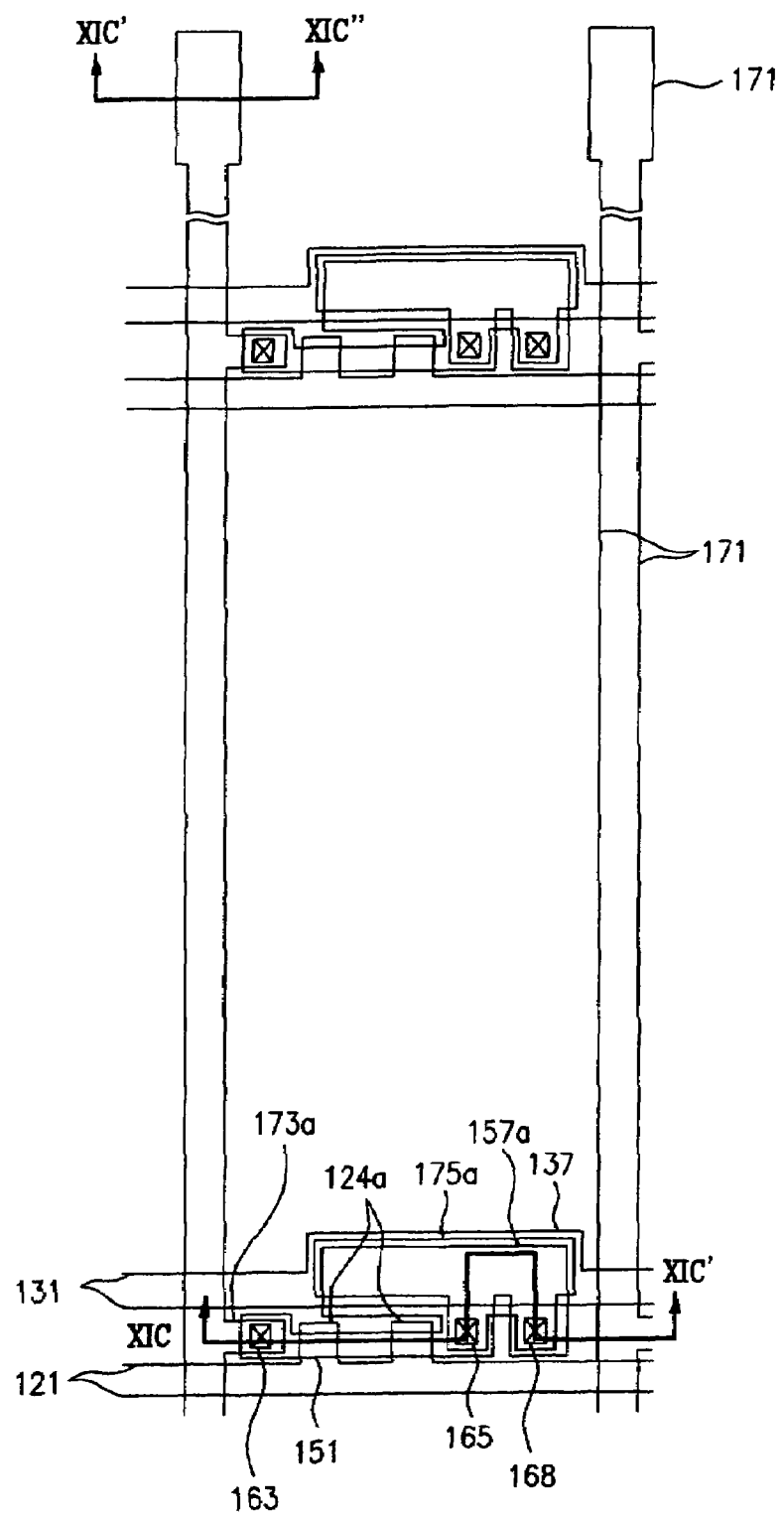
FIGS. 11A and 11B are layout views of the TFT array panel in the step following the step shown in FIGS. 10A to 10C.
Figure 11B:
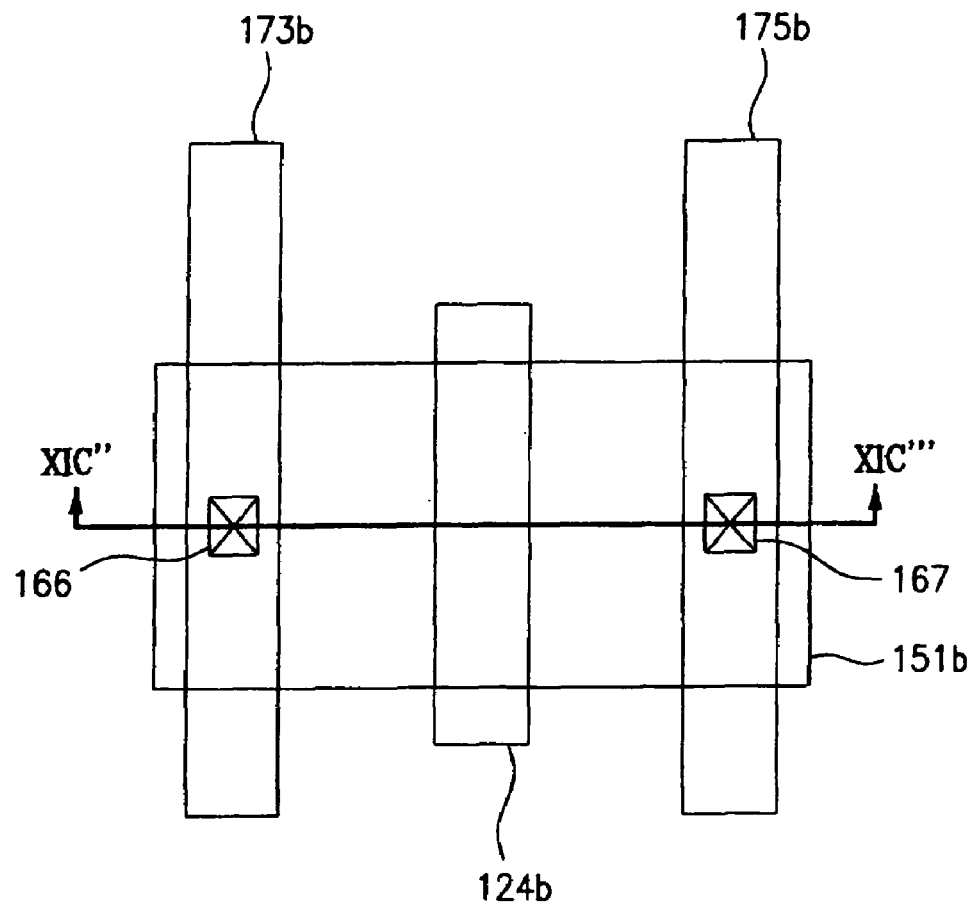
Figure 11C:
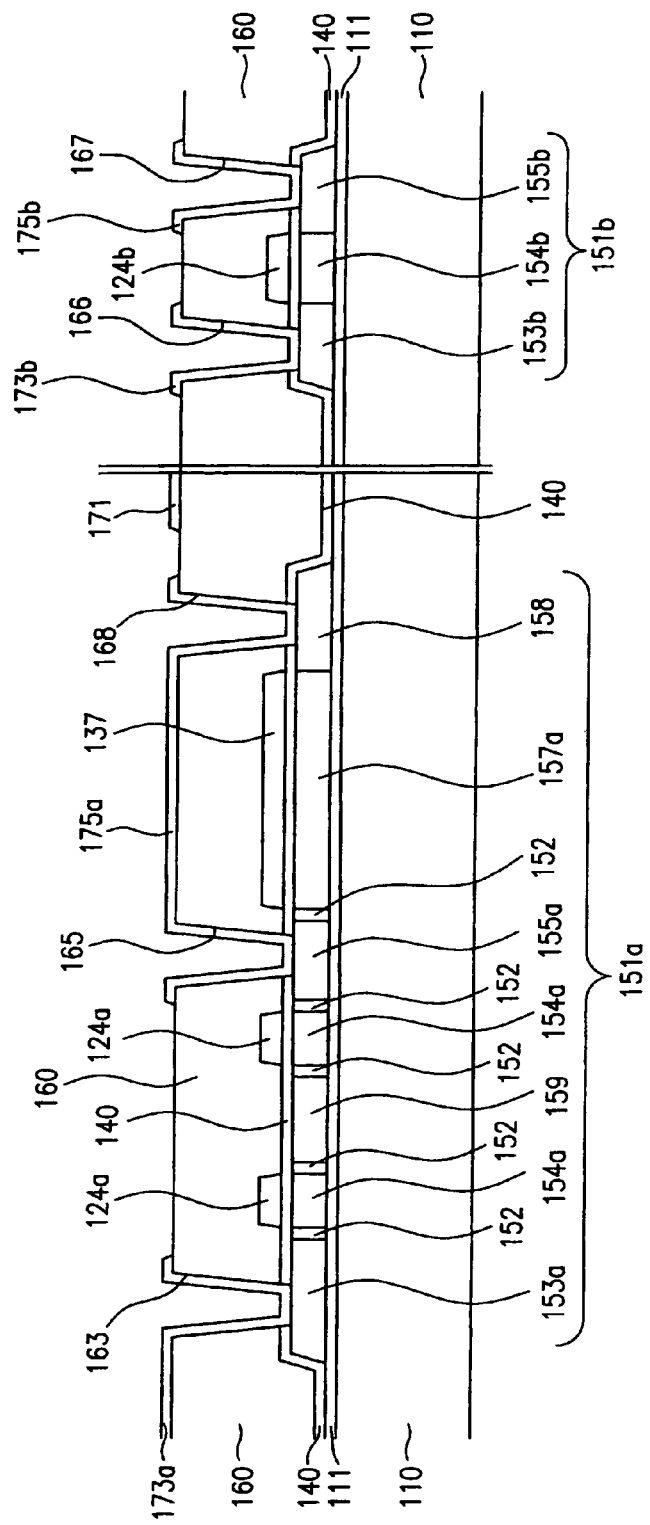
FIG. 11C is a sectional view of the TFT array panel shown in FIGS. 11A and 11B taken along the lines XIC-XIC', XIC'-XIC'', and XIC''-XIC'''.
Figure 12A:
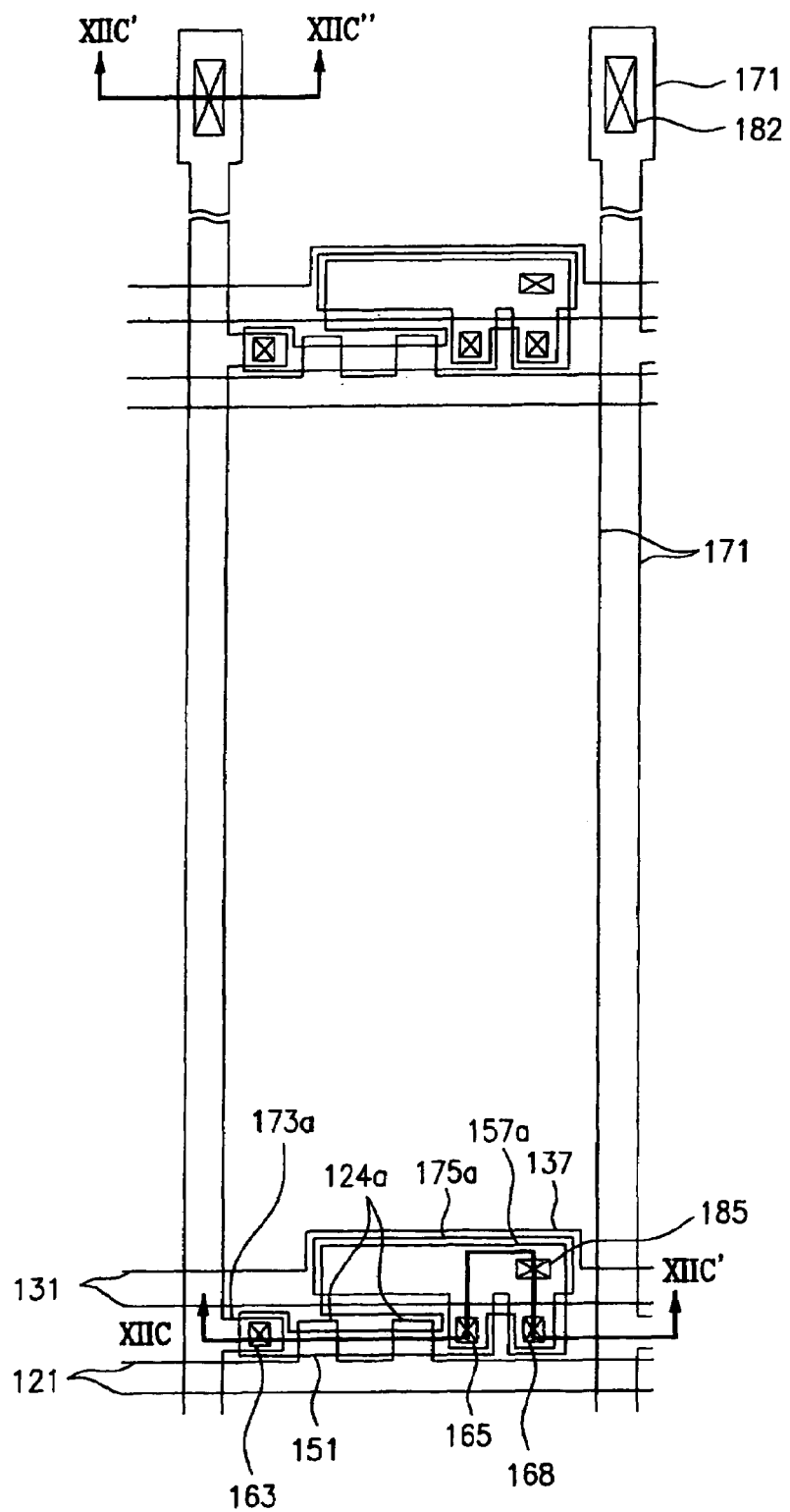
FIGS. 12A and 12B are layout views of the TFT array panel in the step following the step shown in FIGS. 11A to 11C.
Figure 12B:
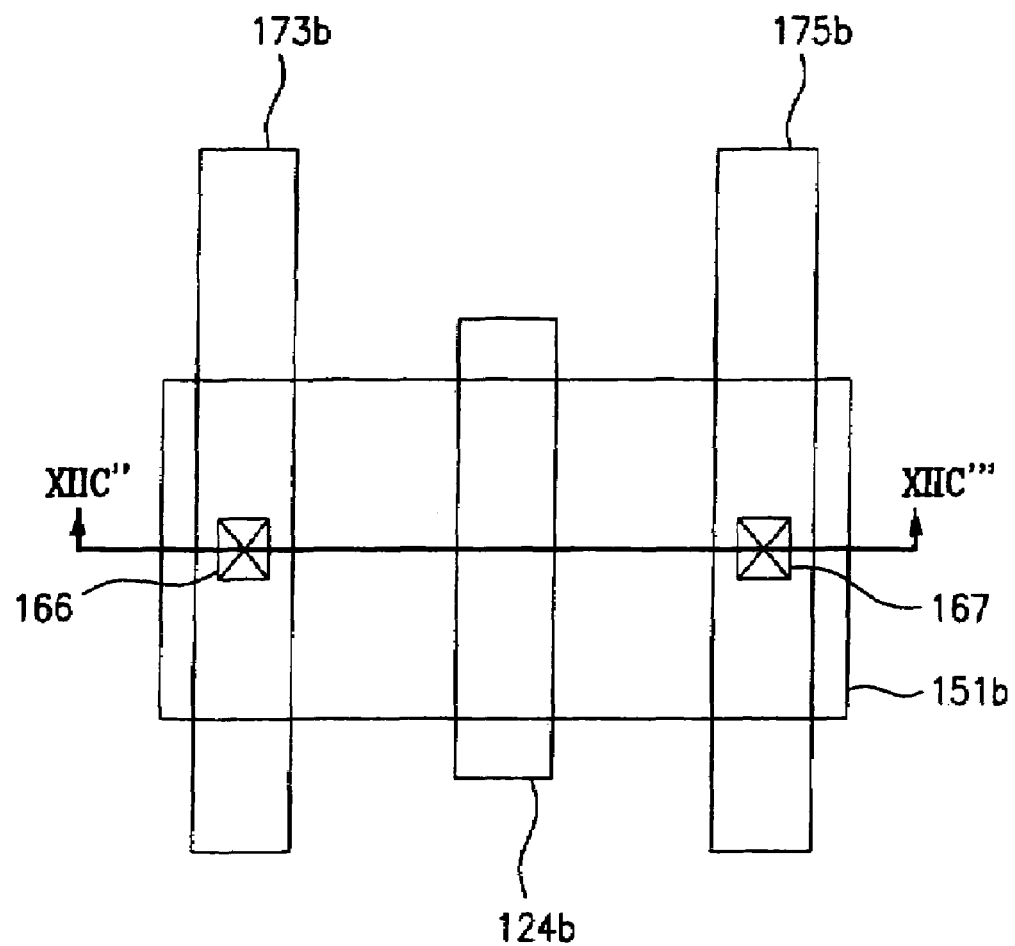
Figure 12C:
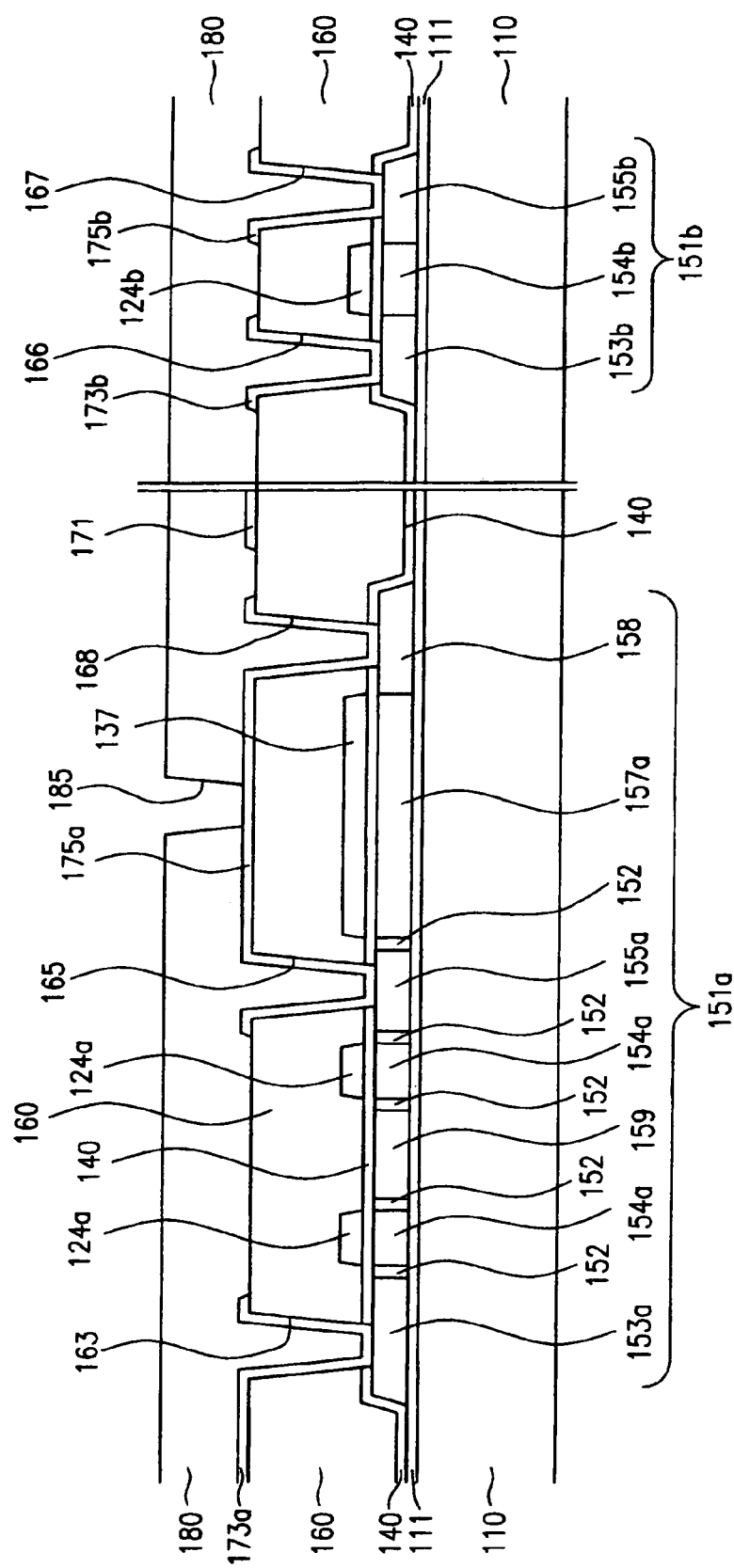
FIG. 12C is a sectional view of the TFT array panel shown in FIGS. 12A and 12B taken along the lines XIIC-XIIC', XIIC'-XIIC'', and XIIC''-XIIC'''.

FIGS. 7A and 7B are layout views of the TFT array panel shown in FIGS. 3 to 6 in the first step of a manufacturing method thereof according to an embodiment of the present invention; FIG. 7C is a sectional view of the TFT array panel shown in FIGS. 7A and 7B taken along the lines VIIC-VIIC', VIIC'-VIIC'', and VIIC''-VIIC'''; FIGS. 8A and 8B are layout views of the TFT array panel in the step following the step shown in FIGS. 7A to 7C; FIG. 8C is a sectional view of the TFT array panel shown in FIGS. 8A and 8B taken along the lines VIIIC-VIIIC', VIIIC'-VIIIC'', and VIIIC''-VIIIC'''; FIG. 9 is a sectional view of the TFT array panel in the step following the step shown in FIGS. 8A to 8C; FIGS. 10A and 10B are layout views of the TFT array panel in the step following the step shown in FIG. 9; FIG. 10C is a sectional view of the TFT array panel shown in FIGS. 10A and 10B taken along the lines XC-XC', XC'-XC'', and XC''-X'''; FIGS. 11A and 11B are layout views of the TFT array panel in the step following the step shown in FIGS. 10A to 10C; FIG. 11C is a sectional view of the TFT array panel shown in FIGS. 11A and 11B taken along the lines XIC-XIC', XIC'-XIC'', and XIC''-XIC'''; FIGS. 12A and 12B are layout views of the TFT array panel in the step following the step shown in FIGS. 11A to 11C; and FIG. 12C is a sectional view of the TFT array panel shown in FIGS. 12A and 12B taken along the lines XIIC-XIIC', XIIC'-XIIC'', and XIIC''-XIIC'''.

Referring to FIGS. 7A to 7C, a blocking film 111 is formed on an insulating substrate 110, and a semiconductor layer preferably made of amorphous silicon is deposited thereon. The semiconductor layer is then crystallized by laser annealing, furnace annealing, or solidification, and patterned by lithography and etching to form a plurality of semiconductor islands 151a and 151b.

Referring to FIGS. 8A and 8C, a gate insulating layer 140 preferably made of silicon oxide or silicon nitride is deposited, and a gate conductor film is deposited sequentially thereon.

Next, a mask metal layer is formed thereon and photoresist (not shown) is formed on the mask metal. The gate conductor film and the mask metal layer are patterned using the photoresist as an etch mask to form a mask MP, a plurality of gate conductors that include a plurality of gate lines 121 including gate electrodes 124a and a plurality of storage conductors 130a on the semiconductor islands 151a, and a plurality of electrode conductors 120a on the semiconductor islands 151b. At this time, the gate conductors 120a fully cover the semiconductor islands 151b, and the gate conductor film is over-etched with respect to the doping mask MP. The over-etching makes edges of the gate conductors 121, 130a, and 120a lie within edges of the doping mask MP. The mask metal layer comprises a material with high etch selectivity with respect to the gate conductor film material. The mask metal layer material may also be thermally and chemically resistant. It is preferable that the gate conductor material includes aluminum, and that the mask metal material includes chromium.

Next, the photoresist is removed, and high-concentration N-type impurities are introduced with a low energy (e.g., about 3-40 eV) into the semiconductor islands 151a and 151b by a doping process such as PECVD or plasma emulsion. As a result, regions of the semiconductor islands 151a and 151b disposed under the mask MP are not doped, while regions of the semiconductor islands 151a not disposed under the mask MP are heavily doped. This step forms source and drain regions 153a and 155a, dummy regions 159, channel regions 154a, and dummy storage regions 157a. Introducing the dopant material at low energy prevents damage that may be caused by high voltage used to stabilize the characteristics of TFTs. The photoresist may be removed after the doping process.

Referring to FIG. 9, the mask MP is removed and low-concentration N-type impurities are implanted with a high energy into the semiconductor islands 151a and 151b (e.g., using scanning equipment or ion beam equipment) such that regions of the semiconductor islands 151a and 151b disposed under the gate conductors 121, 130a, and 120a are not doped, while regions of the semiconductor islands 151a not disposed under the gate conductors 121, 130a, and 120a are heavily doped. This forms lightly doped regions 152 at upper side portions of the channel regions 154a and the dummy storage regions 157a. To form the lightly doped regions 152, a spacer formed at the sides of the gate electrode 124a may be used.

Referring to FIGS. 10A to 10C, a photoresist PR is formed. The portions PR fully cover the display area including the semiconductor islands 151a except for the portion of the storage conductor 130a, and they cover the portion of the electrode conductor 120a opposite the semiconductor islands 151b of the driver. The electrode conductor 120a and the storage conductor 130a are patterned using the photoresist PR. This forms a plurality of gate electrodes 124b and the storage electrode line 131 including the storage electrode 137 to expose portions of the semiconductor islands 151a and 151b. Thereafter, high-concentration P-type impurities are implanted with a low energy (e.g., about 3-40 eV) into the semiconductor islands 151a and 151b by a process such as PECVD or plasma emulsion. As a result, regions of the semiconductor islands 151a and 151b disposed under the photoresist PR are not doped, while regions of the semiconductor islands 151a and 151b not disposed under the photoresist PR are heavily doped. This forms a dummy region 158, a storage region 157, source and drain regions 153b and 155b, and channel regions 154b.

Referring to FIGS. 11A to 11C, an interlayer insulating layer 160 is deposited and patterned to form a plurality of contact holes 163, 165, 166, 167, and 168 exposing the source regions 153a and 153b, the drain regions 155a and 155b, and the dummy regions 158.

Next, a plurality of data conductors including a plurality of data lines 171 including source electrodes 173a for pixel regions, a plurality of drain electrodes 175a for pixel regions, and a plurality of source and drain electrodes 173b and 175b for the driver are formed on the interlayer insulating layer 160.

Referring to FIGS. 12A to 12C, a passivation layer 180 is deposited and patterned to form a plurality of contact holes 185 exposing the drain regions 155a for pixel regions.

Referring to FIGS. 3 and 4, a plurality of pixel electrodes 190 are formed on the passivation layer 180.

As described above, the storage capacitance may be maintained regardless of the voltage applied to the drain electrode, because the drain electrode is connected to P- and N-type regions.

Furthermore, because the storage capacitance may be maximized in a small area, the aperture ratio is enhanced. The storage capacitor may be formed without additional processing, thereby simplifying the manufacturing process of the resulting thin film transistor array panel.

The above descriptions may be adapted to other flat panel display device types, such as OLEDs.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
    a substrate;
    a plurality of semiconductor regions on the substrate, wherein the respective semiconductor regions include a source region and a drain region doped with an N-type impurity, a dummy region doped with a P-type impurity, and intrinsic regions comprising a storage region and a channel region, the storage region being positioned between the drain region and the dummy region;
    a gate insulating layer covering at least a portion of the semiconductor regions;
    a gate line including a gate electrode and formed on the gate insulating layer, wherein the gate electrode at least partially overlaps the channel region;
    a storage line including a storage electrode and formed on the gate insulating layer, wherein the storage electrode at least partially overlaps the storage region;
    a data line including a source electrode connected to the source region and formed on the gate insulating layer;
    a drain electrode directly contacting both the drain region and the dummy region and formed on the gate insulating layer; and
    a pixel electrode connected to the drain electrode.

2. The thin film transistor array panel of claim 1, wherein the drain electrode at least partially overlaps the storage electrode.

3. The thin film transistor array panel of claim 1, further comprising: a blocking layer formed between the substrate and the semiconductor regions.

4. The thin film transistor array panel of claim 1, further comprising:
    one or more lightly doped regions disposed between the source and the drain region and the channel region.

* * * * *